United States Patent [19]

Veneklasen et al.

[11] Patent Number: 4,469,948

[45] Date of Patent: Sep. 4, 1984

[54] COMPOSITE CONCENTRIC-GAP MAGNETIC LENS

[75] Inventors: Lee H. Veneklasen, Castro Valley; William J. DeVore, Hayward, both of Calif.

[73] Assignee: The Perkin-Elmer Corp., Norwalk, Conn.

[21] Appl. No.: 342,696

[22] Filed: Jan. 26, 1982

[51] Int. Cl.³ ............................................. H01J 3/22
[52] U.S. Cl. ........................................... 250/396 ML
[58] Field of Search ......................... 250/396 ML, 398

[56] References Cited

U.S. PATENT DOCUMENTS 3,801,792  4/1974  Lin ..................................... 250/398
3,984,687 10/1983  Loeffler et al. ............. 250/396 ML

FOREIGN PATENT DOCUMENTS 1102327  2/1968  United Kingdom ........ 250/396 ML

Primary Examiner—Alfred E. Smith
Assistant Examiner—Jack I. Berman
Attorney, Agent, or Firm—F. L. Masselle; T. P. Murphy; J. R. Dwyer

[57] ABSTRACT

A composite objective lens for a particle beam lithographic system having deflection coils within the bore of the lens, a solenoidal excitation lens coil, a first set of two or more cylindrical pole pieces with a lens gap and a second set of cylindrical pole pieces arranged concentrically outside the first pole pieces but within the excitation lens coil. The second set of pole pieces is constructed of a high saturation material such as iron with a lens gap coextensive with the gap in the first set of pole pieces. The return flux from the deflection coils is carried by the inner cylindrical pole pieces only, while the flux generated by the lens coil is shared by both the inner and outer pole pieces. With this arrangement the linear relationship between the axial field strength and excitation current is maintained at all points along the axis of the lens, and saturation of the inner pole piece is avoided.

9 Claims, 6 Drawing Figures

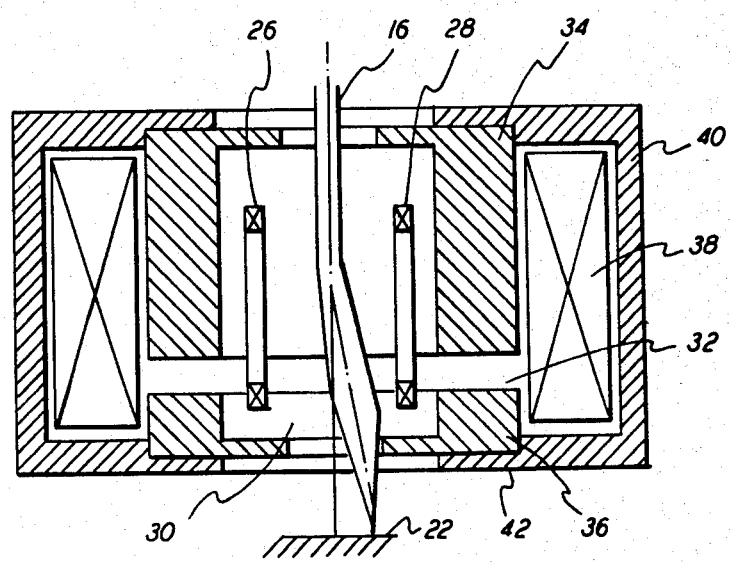
FIG. 2 Prior Art
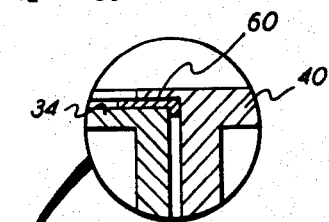
FIG. 5
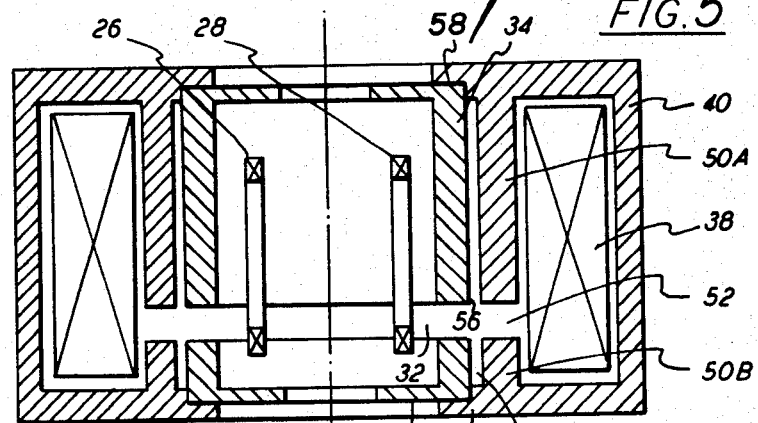
FIG. 4
FIG. 3 Prior Art
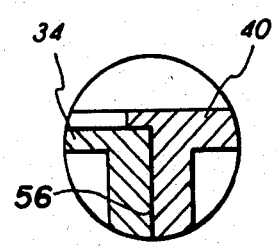
FIG. 6
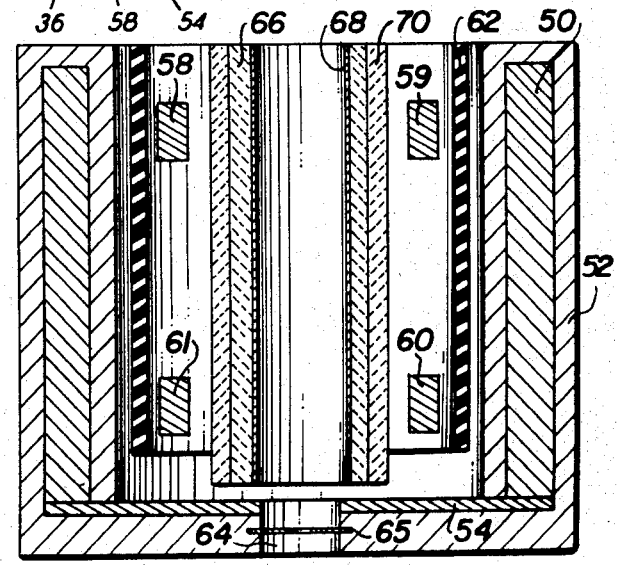

4,469,948

COMPOSITE CONCENTRIC-GAP MAGNETIC LENS

BACKGROUND OF THE INVENTION

This invention relates to charged particle beam lithography and, more particularly, to a new and improved system including a new and improved magnetic electron lens system containing deflection coils.

FIG. 1 illustrates a typical prior art system 10 having a composite objective lens 12. In this Figure, there is provided a particle (electron or ion) source 14 from which is formed a beam 16 directed through a number of apertured plates 18 and blanking and focusing lenses 20 until the beam reaches the composite objective lens 12 for directing the beam onto a target 22. Conventionally, the target 22 is a resist layer positioned on a stage 24 which moves in a direction at right angles to the deflection of the beam. For more detailed information on this writing technique, see the U.S. Patents to Collier, et al. and Lin, Nos. 3,900,737 and 3,801,792, respectively.

FIG. 2 illustrates an enlarged cross-sectional view of the prior art objective lens 12 of FIG. 1 and shown to comprise a pair of deflection coils 26 and 28 within the bore 30 of the lens. The axial focusing field $B_Z(z)$ is formed by one or more gaps 32 located between a pair of cylindrical pole pieces 34 and 36 conventionally of Ferrite material located within a solenoidal excitation lens coil 38. To complete the magnetic circuit, a cylindrical outer return yoke 40, usually made of iron, surrounds the excitation coil 38. The yoke as shown also encompasses the pole pieces by flanges 42 to position the pole pieces.

Deflection coils located with the bore 30 of the lens and surrounded by the Ferrite pole piece cylinders 34 and 36, provide a superimposed axial lens field $B_Z(z)$ and a lateral time dependent deflection field $B_{xy}(z,t)$ which focus the beam 16 on and deflect the beam across the target resist layer 22 located below the lens.

To avoid aberration (degradation of focus) and distortion (nonlinear deflection) it is necessary to carefully design the deflection field $B_{XY}(z)$ to match the axial focusing field $B_Z(z)$ so that the shapes of the magnetic fields generated by the lens and deflectors match over the full range of lens and deflection excitation currents. If, for any reason, the shape $B_Z(z)$ of the focusing field changes non-linearly with lens excitation, then the system's aberration will be optimized for only one value of primary beam voltage.

The shape of the focusing field depends upon the shape and magnetic permeability of the pole pieces. If the permeability of the pole pieces is very high, then the field shape is dominated by gap geometry. However, as the lens excitation increases, the magnetizing force H increases and the permeability decreases. This effect, known as saturation, causes magnetic flux to leak out of the pole piece and into the lens bore, causing the shape of the focusing field to change. In the case of Ferrite pole pieces where the permeability is high only over a relatively narrow range of magnetizing force, this effect is noticeable even at low excitation. Due to the critical nature of the deflection optimization one would ideally maintain the Ferrite material at constant permeability over a wide range of excitation.

The traditional solution to the problem is to provide very thick pole pieces, i.e., thicken the pole pieces 34 and 36 so as to provide a large cross-sectional area, to carry the magnetic load. With a sufficiently large cross section, the Ferrite material does not approach saturation. This solution has several disadvantages. As well as increasing the weight, size and cost of the lens, it does not avoid the fact that the permeability of the Ferrite material changes dramatically over the operating range, resulting in small but significant changes in field shape. Since the iron portion of the lens is further removed from the bore and has a far higher saturation flux, its properties play a ralatively minor role.

Since the Lin patent, supra, shows a composite lens, a brief explanation of its deficiency as prior art is in order at this point. Reference is made to FIG. 3 which is a reproduction of the FIG. 3 of the Lin Patent.

The deflection system 60 is enclosed by a Ferrite cylinder 62 but is not shown as magnetically connected to the iron lens cylinder 52. In this configuration, the Ferrite is being used to provide a return path for the deflection field but, since only a single cylinder is used, the Ferrite is only one of two pole pieces necessary to form a lens field. It differs from the following disclosure insofar as the deflection system cannot be located within or below the lens gap. Further, no mention is made of using the iron gap as a means of reducing saturation in the Ferrite. As drawn the design would suffer from the saturation effects mentioned above.

It is an object of this invention to accommodate a low saturation material within the lens field without significantly affecting the linear relationship between the axial field strength and the excitation current at all points along the axis of the lens.

It is also an object of this invention to provide a new and improved particle beam lithographic system such as shown in FIG. 1 by incorporating a new composite objective lens.

SUMMARY OF THE INVENTION

The invention which accomplishes the foregoing object comprises providing a composite lens having deflection coils within the bore of the lens, a solenoidal excitation lens coil, a first set (pair) of pole pieces with a lens gap, and a second set of pole pieces arranged concentrically outside the first pole pieces but within the lens excitation coil. The second set of pole pieces is constructed of a high saturation material such as iron with a lens gap coextensive with the lens gap in the first set of pole pieces. The return flux from the deflection coils is carried by the inner cylindrical pole piece only, while the flux generated by the lens coil is shared by the two inner and outer pole piece cylinders but partially shunted around the inner pole piece cylinder. Several embodiments of the composite lens are shown utilizing spacers and different materials for the pole piece cylinders.

BRIEF DESCRIPTION OF THE DRAWINGS

FIGS. 1 and 2 represent the prior art particle beam deflection systems and an illustration of composite objective lens with in-lens deflection, FIG. 3 is a reproduction of FIG. 3 of the prior art Lin Patent, supra, FIG. 4 is a composite objective lens constructed in accordance with the teachings of this invention, FIG. 5 illustrates a floating inner pole piece through the use of a spacer in the composite objective lens of this invention, FIG. 6 illustrates the inner and outer pole pieces of differing materials but located contiguous to one another in the composite objective lens of this invention.

DETAILED DESCRIPTION

Figure 1:
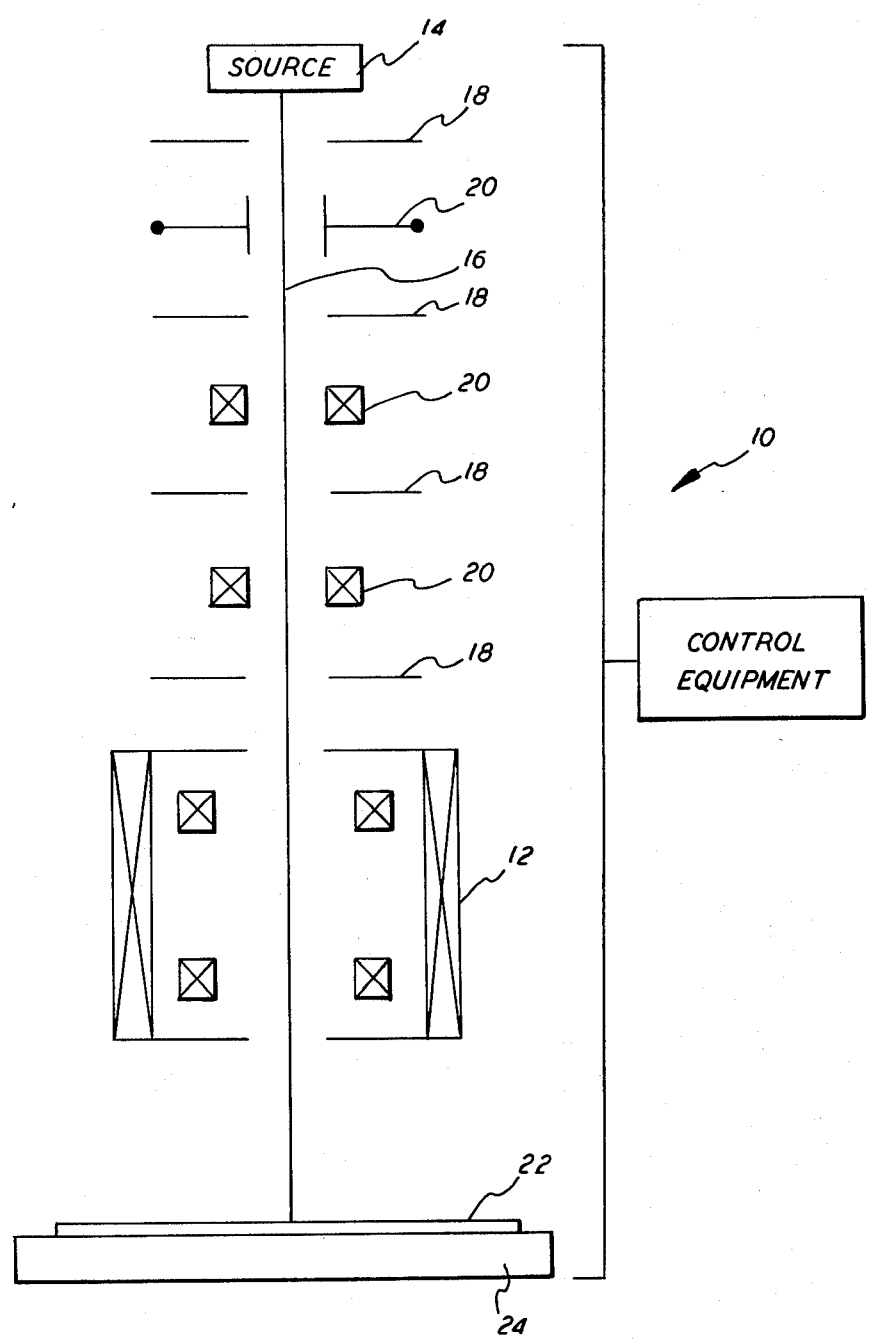

FIGS. 1, 2 and 3 have been described in the Background of the Invention, so attention now is directed to FIG. 4 which illustrates the composite objective lens constructed in accordance with the teachings of this invention.

In this Figure, those elements which have the same function as those in FIG. 2 will be given the same reference numeral. Thus the lens excitation coils 38, deflection coils 26 and 28 and inner pole piece cylinders 34 and 36 are essentially the same. What have been added in this Figure are second or outer cylindrical pole pieces 50A,B shown as being made of the same material and integral with the yoke 40 and containing a gap 52 located coextensive with the gap 32 in the inner pole pieces 34 and 36. These pole pieces 50A,B may or may not be spaced as by radial gap 54 from the outer wall 56 of the inner pole pieces by a step 58 formed in the outer pole piece.

FIG. 5 shows an alternative embodiment of the invention in which the inner pole piece, is provided with a non-magnetic spacer 60 located between the inner and outer pole pieces. The spacer 60 not only allows the inner pole piece to be magnetically isolated but also replaces the function of the step 58 of the embodiment of FIG. 4. This spacer 60 is only functional if the radial gap 54 is used also, the effect of both spacer 60 and radial gap 54 being to magnetically isolate the Ferrite structure. While only one corner of the lens is shown, obviously the spacer is cylindrical and there is a similar spacer at the lower end of the inner pole piece also. The spacer controls that portion of the total focusing field flux that is conducted by the inner pole piece and prevents any deflection field from returning through the yoke.

FIG. 6 shows alternative versions of the composite lens system. FIG. 6 illustrates one of the inner pole pieces, i.e., 34, and outer pole piece 50 as being contiguous with the outer cylindrical walls 56 of the inner pole piece, containing no radial gap.

Experimental tests indicate by a direct comparison between the composite lenses shown in FIGS. 2 and 3, resulted in a factor of 50 improvement in linearity (B(z) versus excitation current) when the lens was excited at a maximum design current. Saturation effects were reduced by a factor of 50.

Qualitatively, the action of the composite lens is generally as follows: At low excitation, the permeability of the Ferrite of the inner pole pieces 34 and 36 is greater than or equal to that of the iron outer pole piece 40 and the lens field is determined by the geometry of the inner surface of the Ferrite inner pole pieces. With increasing excitation, the permeability of the Ferrite inner pole piece attempts to drop below that of the iron so that excess flux is shunted through the gap in the iron outer pole piece 40. Since this latter gap has a geometry very similar to that of the Ferrite inner pole piece, the portion of the lens field due to this gap is nearly the same shape. If the Ferrite inner pole pieces were completely saturated, then the lens field would still maintain a similar shape. However, until iron outer pole piece saturates, the permeability of the inner Ferrite pole pieces never drops far below that of the iron, because its magnetizing force H is limited by the alternate path provided by the outer pole piece that conducts the excess flux. Thus, the permeability of the inner pole pieces cannot drop far below that of the outer pole pieces. Assuming this theory to be true, the field on the axis of the lens is still largely determined by the shape of the inner contours of the inner pole pieces.

What is claimed is:

1. A composite magnetic particle beam lens having deflection coils and comprising more than one cylindrical inner pole pieces of magnetically soft material, surrounding said deflection coils and separated by a lens gap, said lens further including,
    an excitation lens coil outside and surrounding said inner pole pieces,
    an outer return yoke of magnetically soft material surrounding said excitation lens coil,
    said magnetically soft material of said yoke being different from the magnetically soft material of said inner pole pieces, and
    a means for shunting any excess flux from said excitation lens coil around said inner pole pieces to maintain the desired magnetic field within the inner pole pieces.

2. The lens as claimed in claim 1 wherein said shunting means comprises additional pole pieces and a lens gap of high saturation flux material located concentric to and outside of said inner pole pieces.

3. The lens as claimed in claim 2 wherein the material of said outer pieces is of the same material as said yoke.

4. The lens as claimed in claim 2 wherein said outer pole pieces are in intimate radial contact with said inner pieces.

5. The lens as claimed in claim 2 wherein said outer pole pieces are separated from said inner pole pieces by a radial gap.

6. The lens as claimed in claim 2 including means spacing said inner pole pieces from said outer pole pieces by means of two additional axial spacers.

7. The lens as claimed in claim 6 wherein said spacing means comprises rings of non magnetic material.

8. In a particle beam lithographic system having means for generating a particle beam, means for shaping, blanking and focusing said beam including a composite objective lens, the improvement in the composite objective lens comprising,
    a plurality of cylindrical inner pole pieces of magnetically soft material separated by a lens gap and surrounded by an excitation lens coil outside the pole pieces,
    an outer return yoke of magnetically soft material surrounding said excitation lens coil, and of magnetically different material from the material of the inner pole pieces, and
    means for shunting the excess flux from said excitation lens coil around said inner pole pieces to maintain the desired magnetic field within the inner pole pieces.

9. A composite objective lense having a bore through which a particle beam is directed for shaping and focusing therein comprising,
    deflection coil means within said bore,
    a first pole means having a first lens gap therein,
    a second pole means arranged outside the first pole means and having a second lens gap coextensive with the first lens gap,
    solenoidal excitation lens coil means surrounding both said pole means, the second pole means being constructed of a high magnetic saturation material, the arrangement of said first and second pole means and lens coil means being such that return flux from the deflection coil means is carried by the first pole means and the flux generated by the excitation lens coil means is shared by the first and second pole means so that a linear relationship in axial field strength and excitation current is maintained at all points along the bore of the lens and saturation of the first pole means is avoided.

* * * * *